(12) United States Patent
Han (10) Patent No.: US 7,141,880 B2
(45) Date of Patent: Nov. 28, 2006

(54) METAL LINE STACKING STRUCTURE IN SEMICONDUCTOR DEVICE AND FORMATION METHOD THEREOF

(75) Inventor: Jae-Won Han, Bucheon (KR)

(73) Assignee: Dongbuanam Semiconductor Inc., Seoul (KR)

( * ) Notice: Subject to any disclaimer, the term of this patent is extended or adjusted under 35 U.S.C. 154(b) by 75 days.

(21) Appl. No.: 10/418,791

(22) Filed: Apr. 18, 2003

(65) Prior Publication Data
US 2004/0209461 A1  Oct. 21, 2004

(30) Foreign Application Priority Data
Apr. 19, 2002 (KR) ............. 10-2002-0021608

(51) Int. Cl.
*H01L 23/48* (2006.01)

(52) U.S. Cl. .............. 257/751; 257/774; 257/763; 257/764; 257/767; 257/773; 257/E23.16

(58) Field of Classification Search ............ 257/774, 257/751, 763, 764, 767, 773, E23.16; 438/653
See application file for complete search history.

(56) References Cited

U.S. PATENT DOCUMENTS

| | | | | |
|---|---|---|---|---|
| 5,563,099 A | * | 10/1996 | Grass | 438/632 |
| 5,990,011 A | * | 11/1999 | McTeer | 438/692 |
| 6,204,179 B1 | * | 3/2001 | McTeer | 438/687 |
| 6,218,733 B1 | * | 4/2001 | Fiordalice et al. | 257/751 |
| 6,433,433 B1 | * | 8/2002 | Sengupta | 257/763 |
| 6,747,354 B1 | * | 6/2004 | Kim et al. | 257/751 |
| 2002/0109235 A1 | * | 8/2002 | Leiphart | 257/774 |

* cited by examiner

*Primary Examiner*—Eugene Lee
(74) *Attorney, Agent, or Firm*—Fulbright & Jaworski L.L.P.

(57) ABSTRACT

The method for forming a metal line stacking structure according to a preferred embodiment of the present invention comprises: sequentially forming a first barrier metal and a first metal layer on a lower dielectric layer that is disposed over a semiconductor substrate, and performing a plasma treatment; forming a second barrier metal on the plasma-treated first metal layer; selectively etching the second barrier metal, the first metal layer, and the first barrier metal to form a metal line layer including the second barrier metal, the first metal layer, and the first barrier metal, which respectively have a predetermined width; and sintering the metal line layer to raise a reaction between the first metal layer and the second barrier metal, thereby generating a metal compound layer.

7 Claims, 7 Drawing Sheets

METAL LINE STACKING STRUCTURE IN SEMICONDUCTOR DEVICE AND FORMATION METHOD THEREOF

BACKGROUND OF THE INVENTION (a) Field of the Invention

The present invention relates to a method for manufacturing a semiconductor device, and more particularly, to a method for forming a metal line stacking structure in a semiconductor device.

(b) Description of the Related Art

As semiconductor devices have become more highly integrated and multi-layered, a multi-layer line technology has been introduced as an important manufacturing technology. In such multi-layer line technology, a metal line and a dielectric layer are alternately formed over a semiconductor substrate on which electric circuit elements are formed. The metal line, which are divided by the dielectric layer, are electrically connected together through a contact or via, so that an electric circuit operates.

By applying the multi-layer line technology to a semiconductor device, cross lining has been achieved, so that a freedom of degree and an integration degree in semiconductor device design has been improved, and furthermore, it is possible to decrease a length of a line so that an operation time delay in the line can also be decreased, thereby increasing operation speed of the semiconductor device.

A conventional method for forming a stacking structure of metal lines in a semiconductor device will be explained in detail with reference to the attached drawings. FIGS. 1a to 1f show the conventional method for forming a metal line stacking structure in a semiconductor device.

Figure 1A:
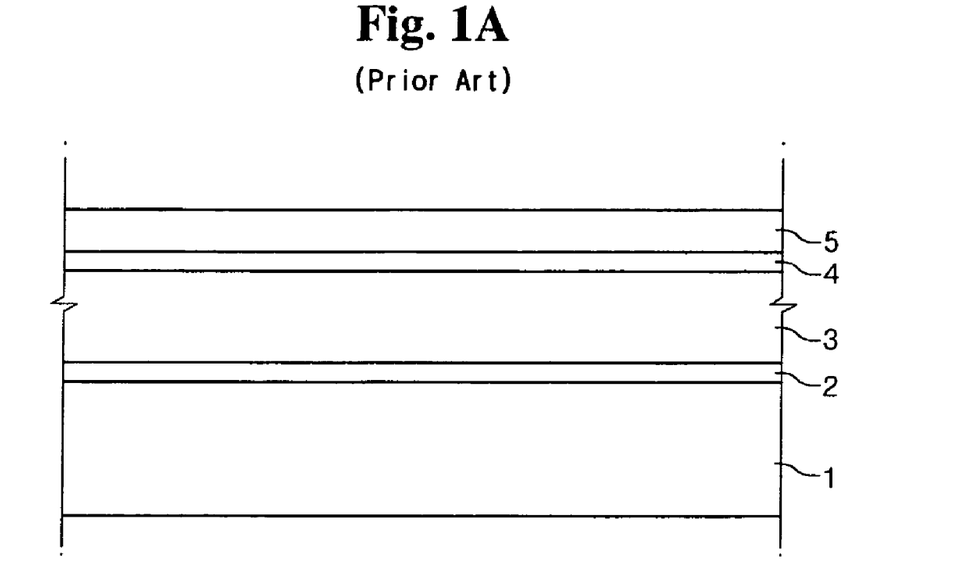
FIGS. 1a to 1f are schematic cross-sectional views showing a method for forming a stacking structure of metal lines in a semiconductor device according to a prior art.

As shown in FIG. 1a, a metal stacking structure is formed by sequentially stacking a barrier metal (Ti) layer (hereinafter referred to as a first Ti layer) 2, a metal (Al) layer (hereinafter referred to as an Al layer) 3, a titanium (Ti) layer (hereinafter referred to as a second Ti layer) 4, and a titanium nitride (TiN) layer (hereinafter referred to as a TiN layer) 5 on a dielectric layer 1, which is disposed over a semiconductor device substrate and is provided with a contact.

Figure 1B:
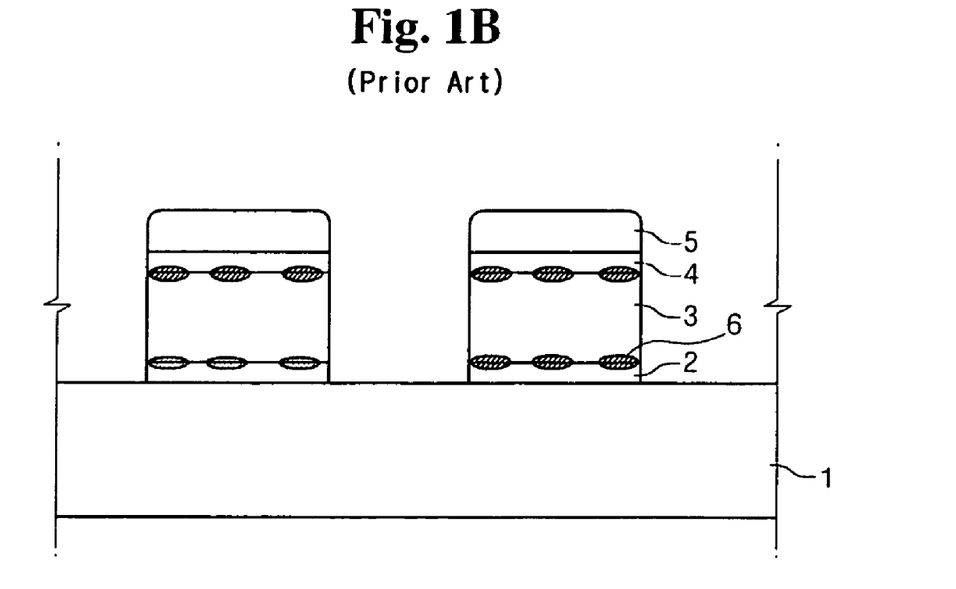

Next, as shown in FIG. 1b, the metal stacking structure is patterned according to a predetermined design and is sintered to form a desired metal line layer. Consequently, $TiAl_3$ 6 is generated in some regions between the Al layer 3 and the first and second Ti layers 2 and 4. In the figures, the relative size of the $TiAl_3$ 6 has been exaggerated for convenience of explanation.

Figure 1C:
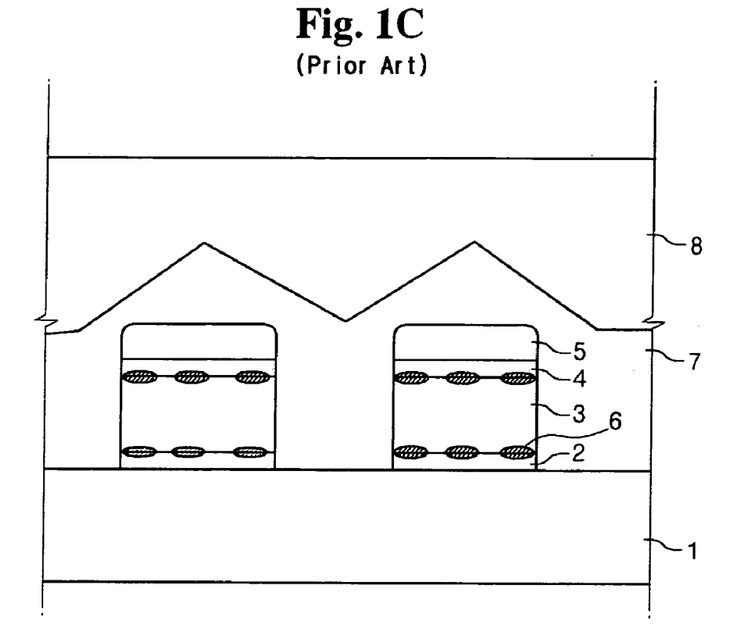

As shown in FIG. 1c, a dielectric layer 7 is then formed through a HDP (High Density Plasma) method or an SOG (Spin On Glass) method, so that a gap between the metal line layer is filled. Then, an inter-level dielectric layer 8 is deposited over the dielectric layer 7, and is then leveled.

Figure 1D:
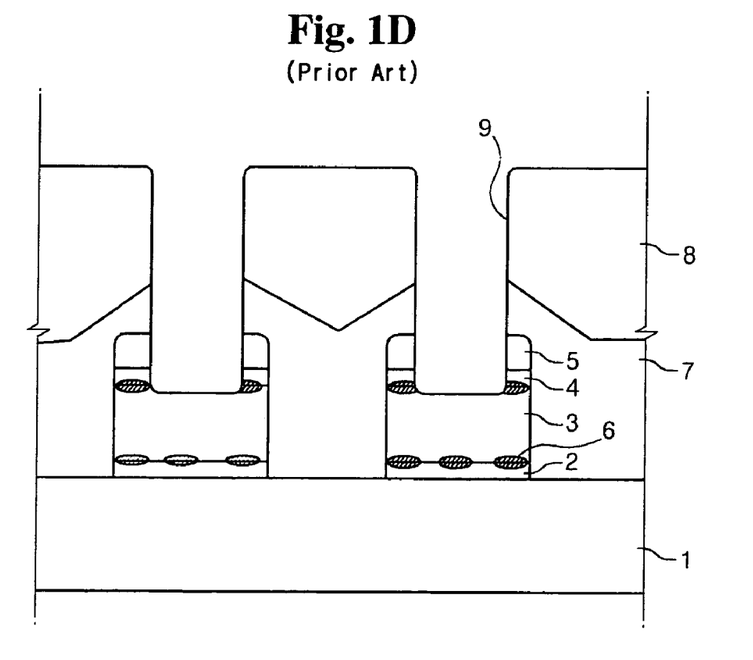

Next, as shown in FIG. 1d, a contact hole 9 is formed in the inter-level dielectric layer 8. In order to decrease the resistance of the contact hole 9 and a resistance change of the contact hole 9 in a wafer, in an etching process to form the contact hole 9, the TiN layer 5 and the Ti layer 4 are over-etched, and etching is terminated after reaching the Al layer 3.

Figure 1E:
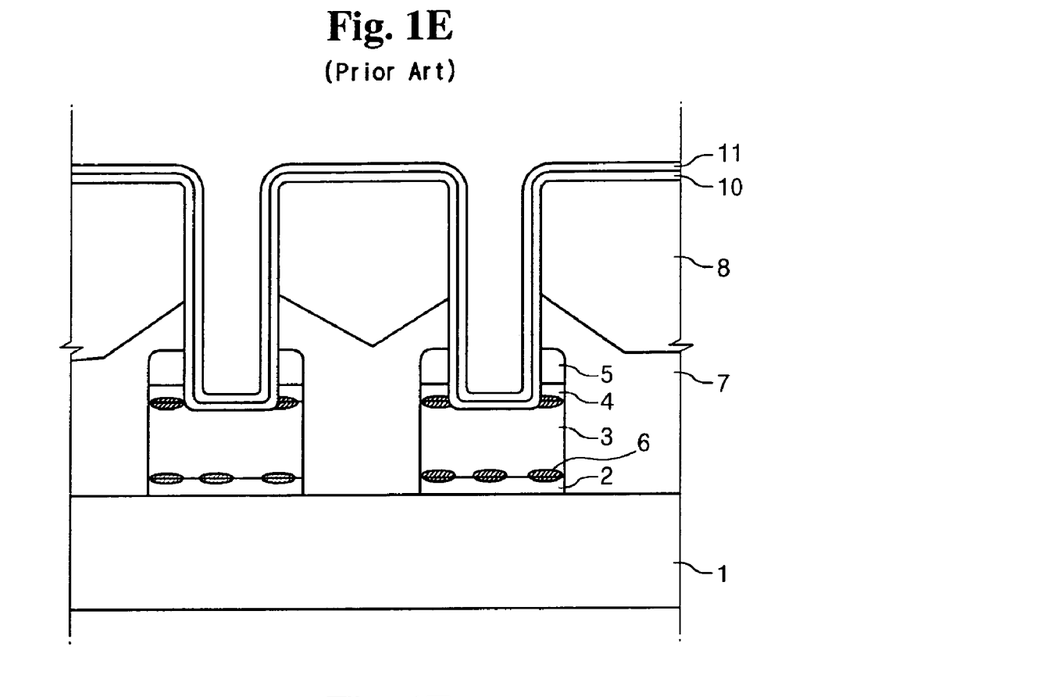

Next, as shown in FIG. 1e, a barrier metal layer, which is a stacking structure of a titanium (Ti) layer 10 and a titanium nitride (TiN) layer 11, is formed on the inter-level dielectric layer 8 and on an inner wall of the contact hole 9 through an in-situ method.

Figure 1F:
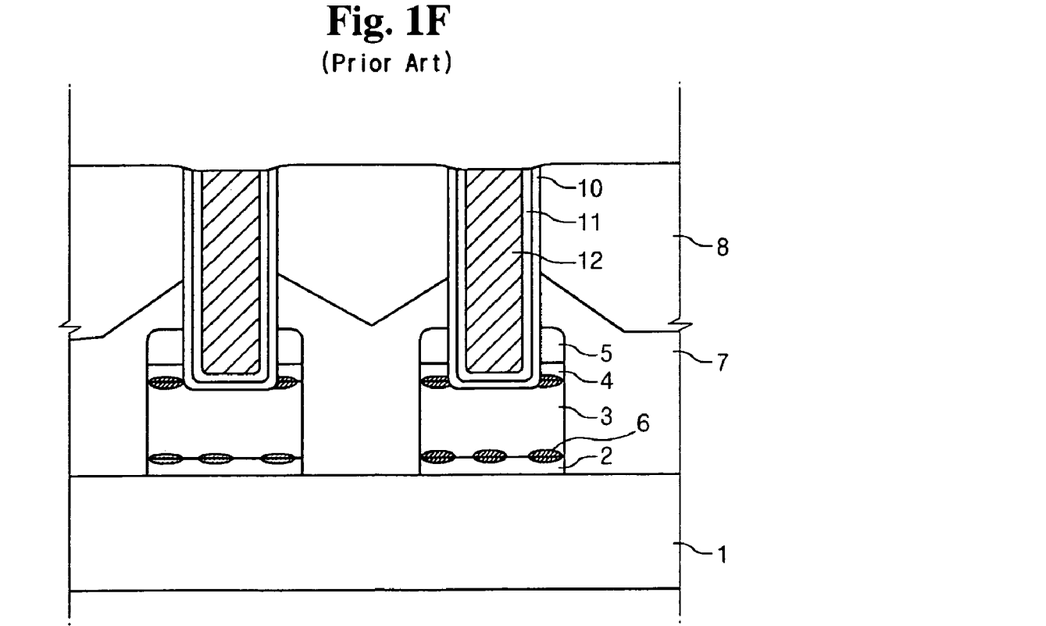

Because the contact holes are now formed deeper and narrower as the integration degree of semiconductor devices has increased, it is preferable that the TiN layer 11 is formed through a CVD (chemical vapor deposition) method in order to increase the bottom step coverage of the barrier metal. Then, as shown in FIG. 1f, a metal (for example, tungsten) layer (hereinafter referred to as a tungsten layer) is deposited in the contact hole 9 through a CVD (Chemical Vapor Deposition) method such that the contact hole 9 is filled with the tungsten. Then, the tungsten layer is polished and leveled through a chemical mechanical polishing (CMP) method until the inter-level dielectric layer 8 is exposed. Therefore, a contact is realized by forming a tungsten plug 12, which is a portion of the tungsten layer, inside the contact hole 9.

The metal line stacking structure in a semiconductor device can be obtained according to the above processes. The above processes are repeated in proportion to a number of metal layers that are needed for a specific semiconductor device.

However, the above conventional method for forming the metal line stacking structure in a semiconductor device has some problems, as follows.

The temperature of the substrate is increased to between 400 and 470 degrees Celsius in order to form the TiN layer 11 in the contact hole 9 through the chemical vapor deposition method. During the process of forming the TiN layer 11 on the high-temperature substrate, thermal energy of the substrate is transmitted to the metal layer, and thereby the metal layer upwardly extrudes through the bottom of the contact hole 9. The extruded metal layer reacts with the Ti layer 10, so that impurities are generated.

For example, if Al is used as the metal layer, $TiAl_3$ is generated, so that a loss of Ti occurs. Therefore, the thickness of a portion of the TiN layer 11 corresponding to this area is relatively thin when compared to other portions.

Such an up-extrusion of the metal layer also occurs in the process of forming the Ti layer 10 if the temperature of the substrate is 280 degrees Celsius or higher.

The thin TiN layer 11 of the barrier metal cannot act as a barrier for a source for forming the metal layer 12. For example, when tungsten is used for the metal layer, the thin TiN layer 11 cannot act as a barrier for an F radical of $WF_6$. Therefore, a $TiAl_xF_y$ composition, which causes high resistance of the contact hole, is disposed under the TiN layer 11. Thus, the resistance of the contact hole increases, and this may degrade performance of a semiconductor device and cause the same not to operate.

If the temperature of the substrate is decreased in order to solve the above problem, productivity lowers. For example, if the temperature of the substrate is decreased to 400 degrees Celsius from 450 degrees Celsius during the formation of the TiN layer of the barrier metal layer, throughput is decreased by more than 55%, so that efficiency of use of facilities and productivity are decreased.

SUMMARY OF THE INVENTION

The present invention has been made in an effort to solve the above problems.

It is a motivation of the present invention to provide a method for forming a stacking structure of metal lines in a semiconductor device, in which an up-extrusion of a metal layer of a metal line can be prevented, without lowering the temperature of a substrate during the formation of a barrier metal.

In a preferred embodiment of the present invention, the method for forming a metal line stacking structure in a semiconductor device comprises: sequentially forming a first barrier metal and a first metal layer on a lower dielectric layer that is disposed over a semiconductor substrate, and performing a plasma treatment; forming a second barrier metal on the plasma treated first metal layer; selectively etching the second barrier metal, the first metal layer, and the first barrier metal to form a metal line layer including the second barrier metal, the first metal layer, and the first barrier metal, which respectively have a predetermined width; and sintering the metal line layer to raise a reaction between the first metal layer and the second barrier metal, thereby generating a metal compound layer.

Preferably, the method for forming a metal line stacking structure further comprises: depositing an inter-level dielectric layer over all the metal line layer and the lower dielectric layer, after the step of sintering the metal line layer; selectively etching the inter-level dielectric layer to form a contact hole; and forming a third barrier metal on an inner wall of the contact hole, and forming a second metal on the third barrier metal to form a metal plug charging the contact hole.

It is preferable that when forming the contact hole, etching is terminated in the metal compound layer such that a bottom surface of the contact hole is positioned within the metal compound layer.

It is also preferable that the second barrier metal includes a titanium (Ti) layer and a titanium nitride (TiN) layer that are sequentially deposited over the first metal layer.

Preferably, a thickness of the titanium layer is between 100 and 300 □, and wherein a thickness of the titanium nitride layer is between 200 and 600 □.

It is further preferable that a thickness of the first metal layer is between 3000 and 8000 □.

It is preferable that the first metal layer is made of a material selected from the group consisting of aluminum, an aluminum-copper (0.2 to 1.0% copper) alloy, an aluminum-copper-silicon (0.2 to 1.0% copper, and 0.5 to 2% silicon) alloy, and an aluminum-silicon (0.5 to 2.0% silicon) alloy.

It is preferable that the metal compound layer comprises TiAl$_3$ that is generated by a reaction between aluminum of the first metal layer and titanium of the second barrier metal.

It is further preferable that the metal compound layer is formed by a reaction of an upper portion of the first metal layer and the titanium layer, and it is formed on the first metal layer.

It is still further preferable that during the plasma treatment, power is supplied to the substrate at 50 to 500 W with a frequency of 1 to 999 MHz, and power is supplied to a chamber side wall at 50 to 500 W with a frequency of 1 to 999 KHz.

Preferably, the plasma treatment is performed using gas selected from the group consisting of argon (Ar), neon (Ne), krypton (Kr), xenon (Xe), and a mixture of hydrogen (H$_2$) and nitrogen (N$_2$), with a flow rate of 1 to 99 sccm, for 1 to 99 seconds.

It is preferable that the sintering is performed within a temperature range of 350 to 450 degrees Celsius.

Preferably, the sintering is performed for 20 to 60 minutes in a nitrogen-bearing atmosphere within an electric furnace.

It is preferable that the sintering is performed for 10 to 60 seconds using a rapid thermal process method.

It is further preferable that the method for forming a metal line stacking structure further comprises forming a lower dielectric layer charging a gap between the metal line layer through a high density plasma method or a spin on glass method before depositing the inter-level dielectric layer.

In another preferred embodiment of the present invention, the metal line stacking structure in a semiconductor device comprises: a metal line layer, a metal compound layer, an inter-level dielectric layer, a contact hole, and a metal plug.

The metal line layer is formed on a lower dielectric layer being disposed over the semiconductor device, and the metal line layer has a predetermined width and includes a first barrier metal, a first metal layer, and a second barrier metal that are sequentially stacked.

The metal compound layer is formed between the first metal layer and the second barrier metal. The inter-level dielectric layer is formed over all the lower dielectric layer and the metal line layer. The contact hole is formed in the inter-level dielectric layer, a bottom of which is located within the metal compound. The metal plug is charged into the contact hole.

It is preferable that the second barrier metal includes a titanium (Ti) layer and a titanium nitride (TiN) layer, wherein the TiN layer is formed on the Ti layer, and wherein a thickness of the Ti layer is between 100 and 300 □, and a thickness of the TiN layer is between 200 and 600 □.

It is also preferable that the first metal layer is formed of a material selected from the group of aluminum, an aluminum-copper (0.2 to 1.0% copper) alloy, an aluminum-copper-silicon (0.2 to 1.0% copper, and 0.5 to 2% silicon) alloy, and an aluminum-silicon (0.5 to 2.0% silicon) alloy, and wherein a thickness of the first metal layer is between 3000 and 8000 □.

Preferably, the metal compound layer comprises TiAl$_3$ that is generated by a reaction between aluminum of the first metal layer and titanium (Ti) of the Ti layer.

It is preferable that the metal line stacking structure further comprises a third barrier metal formed on an inner wall of the contact hole.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings. FIGS. 2a to 2h show a method for forming a metal line stacking structure in a semiconductor device according to the preferred embodiment of the present invention.

Figure 2A:
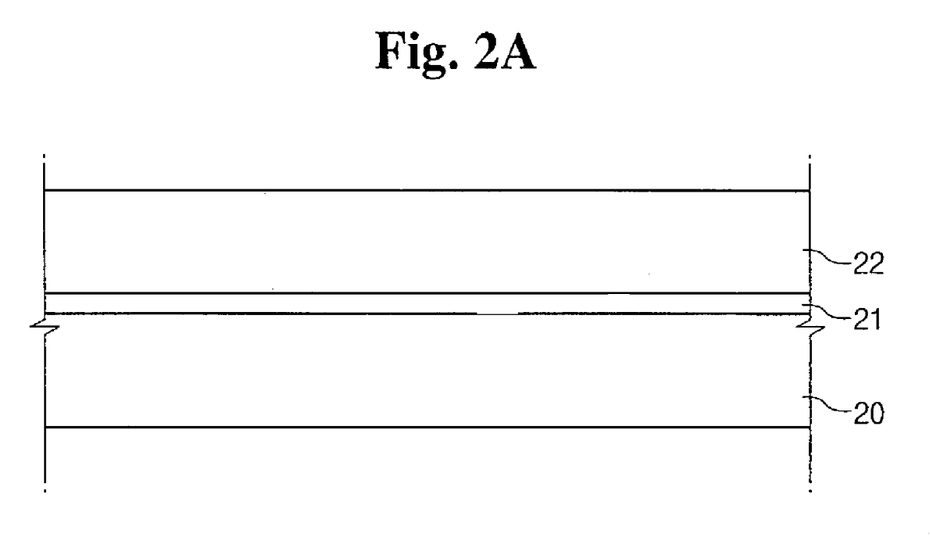
FIGS. 2a to 2h are schematic cross-sectional views showing a method for forming a stacking structure of metal lines in a semiconductor device according to a preferred embodiment of the present invention.

First, as shown in FIG. 2a, a barrier metal 21 and a metal layer 22 are sequentially stacked on a dielectric layer 20. The dielectric layer 20 may be disposed over a semiconductor substrate, and a contact or via is formed in the dielectric layer 20.

Figure 2B:
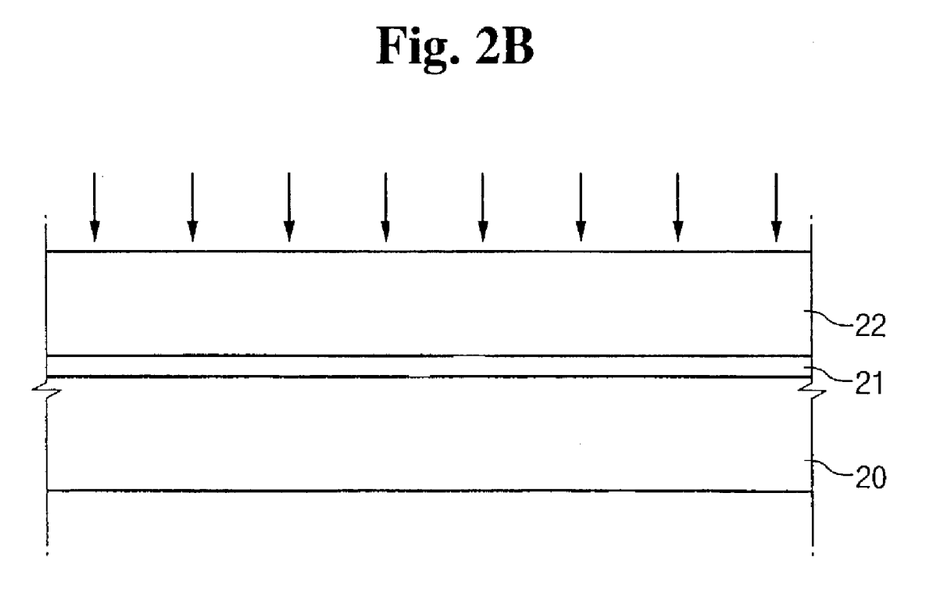

Next, as shown in FIG. 2b, the metal layer 22 is plasma-treated and the size of the grain on the surface of the metal layer 22 is decreased.

Figure 2C:
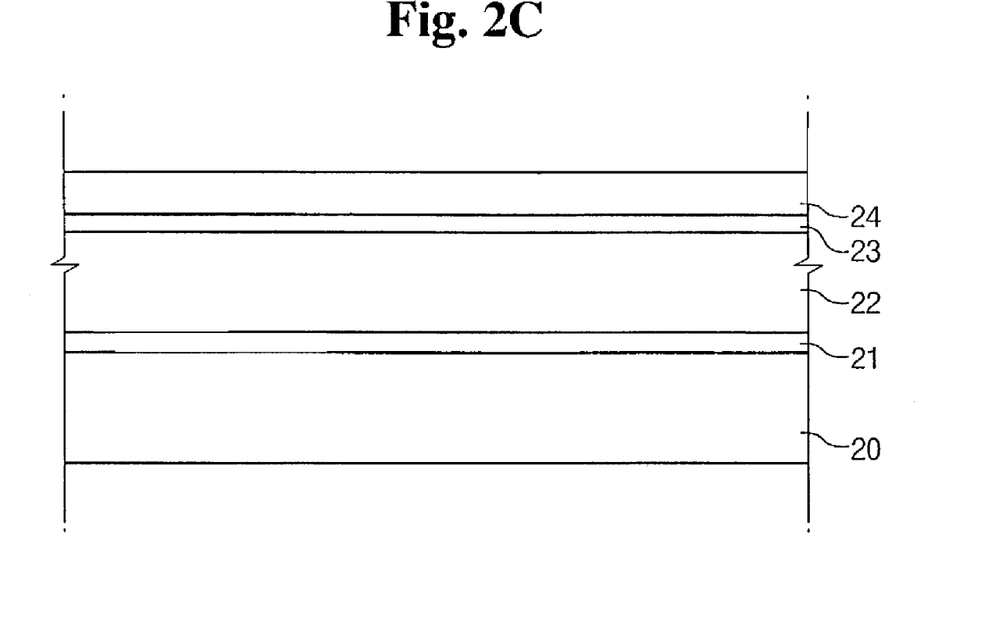

Next, as shown in FIG. 2c, a titanium (Ti) layer (hereinafter referred to as a Ti layer) 23 and a titanium nitride (TiN) layer (hereinafter referred to as a TiN layer) 24 are stacked in order on the plasma-treated metal layer 22. In this manner, a metal stacking structure including the barrier metal 21, the plasma-treated metal layer 22, the Ti layer 23, and the TiN layer 24 is obtained.

This metal stacking structure can be applied to all multi-metal line layer structure except at a highest-positioned metal line layer.

If the above-stated metal stacking structure corresponds to a lowest-positioned metal line layer structure, the dielectric layer 20 is a pre metal dielectric (PMD) including a contact being filled with a metal plug.

In addition, if the above-stated metal stacking structure corresponds to a metal line layer structure other than the highest-positioned layer or the lowest-positioned layer, the dielectric layer is a inter-level dielectric layer (ILD) including a via being filled with a metal plug.) on a multi metal line layer that is patterned according to a predetermined design and sintered.

In the metal stacking structure, the suface of the plasma-treated metal layer 22 having the small grain size reacts with the Ti layer 23 and is changed to $TiAl_3$ during the following sinter process. $TiAl_3$ acts as a etch stop layer and is disposed under the contact hole to prevent an up-extrusion of the metal layer 22.

It has been found through experimentation that in order to prevent oxidation of the metal layer 22, the plasma treatment of the metal layer 22 must be performed in-situ in a chamber for forming the metal stacking structure without vacuum break.

During the plasma treatment, electrical power is applied to the substrate at 50 to 500 W with a frequency of 1 to 999 MHz, and electrical power is applied to the chamber side wall at 50 to 500 W with a frequency of 1 to 999 KHz.

Gas used in the plasma treatment can be an inert gas such as argon (Ar), neon (Ne), krypton (Kr), xenon (Xe), or the like, or a mixture of hydrogen $H_2$ and nitrogen $N_2$. The plasma treatment is performed using such gas at a flow rate of 1 to 99 sccm for a time period of 1 to 99 of seconds, and the size of the grain of the metal layer 22 is then decreased to such a value at which $TiAl_3$ having a desired thickness and a desired uniformity can be formed.

In view of a gap-filling efficiency, the metal stacking structure should not be too thick, and furthermore, because resistance of a metal line increases if $TiAl_3$ is formed, the metal stacking structure should not be too thin.

Therefore, it is preferable that a thickness of the barrier metal 21 is within a range of 100 to 900 □. In particular, if the barrier metal 21 is formed of a Ti layer only, a thickness thereof is preferably between 100 and 300 □, and if the barrier metal 21 is made of a Ti layer and a TiN layer, a thickness of the Ti layer is preferably between 100 to 300 □ and that of the TiN is between 100 to 600 □.

The metal layer 22 is preferably formed of a general conducting metal such as aluminum, an aluminum alloy, and copper, and a thickness thereof is preferably between 3000 to 8000 □. A thickness of the Ti layer 23 is preferably between 100 to 300 □, and that of the TiN layer 24 is preferably between 200 to 600 □.

The aluminum alloy for use in the metal layer 22 can be an aluminum-copper alloy (preferably 0.2 to 1.0% copper), an aluminum-copper-silicon alloy (preferably 0.2 to 1.0% copper, and 0.5 to 2.0% silicon), or an aluminum-silicon alloy (preferably, 0.5 to 2.0% silicon).

Figure 2D:
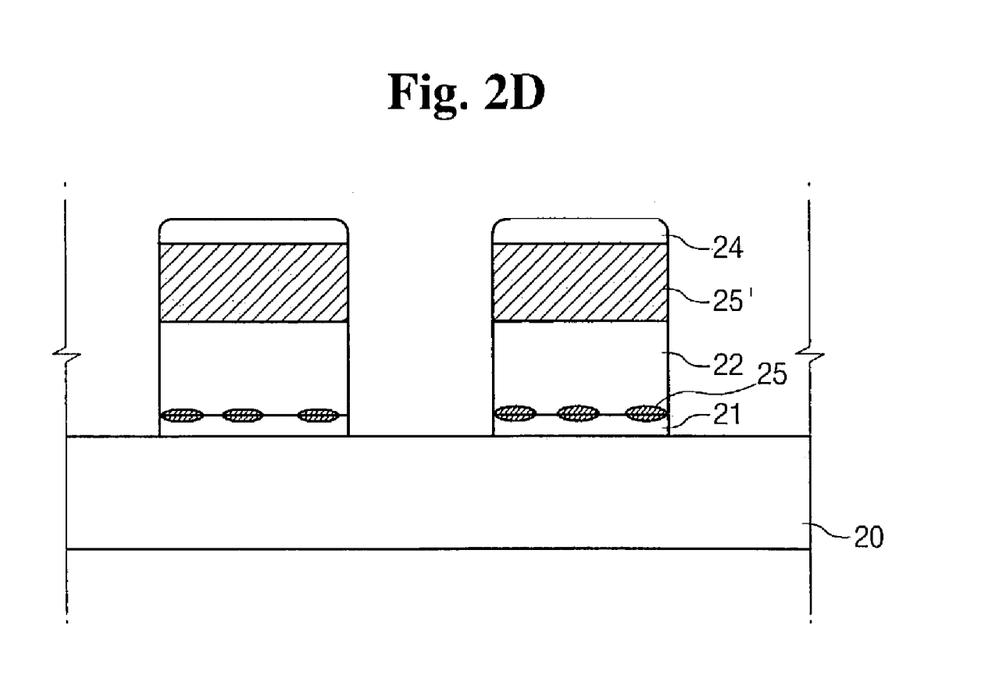

As shown in FIG. 2d, in order to form a metal line layer, the metal stacking structure is patterned according to a predetermined design and is then sintered.

The sintering process is performed at 350 to 450 degrees Celsius, and it is preferable that the sintering process is performed for 20 to 60 minutes in a nitrogen-bearing atmosphere in an electric furnace, or it is performed for 10 to 60 seconds through a rapid thermal process (RTP) method.

During the sintering process at 350 to 450 degrees Celsius, $TiAl_3$ is formed as a result of a reaction of Ti and Al. Therefore, if the barrier metal 21 is formed of titanium (Ti) and the metal layer 22 is formed of aluminum (Al), $TiAl_3$ 25 is formed in interface between the barrier metal 21 and the metal layer 22. In FIG. 2d, for convenience of explanation of the invention, the relative size of the $TiAl_3$ 25 is exaggerated.

Furthermore, because a grain size of the surface of the plasma-treated metal layer 22 has been decreased, an upper portion of the metal layer (in the case of an aluminum metal layer) 22 much more easily reacts with the Ti layer 23 than a lower portion thereof, so that a uniform and thick $TiAl_3$ layer 25' is formed as a result of the reaction.

Figure 2E:
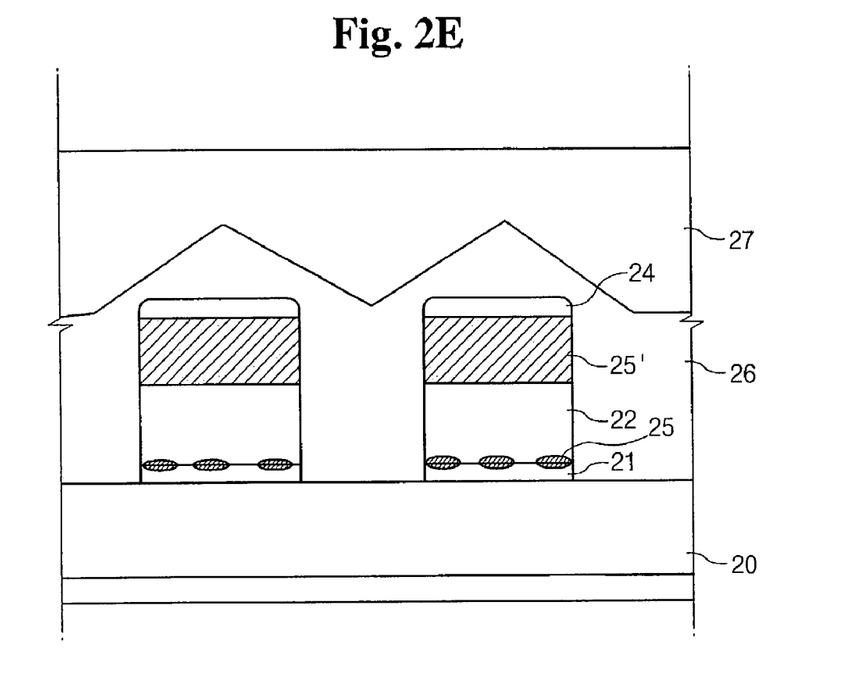

As shown in FIG. 2e, a dielectric layer is then formed over all the metal stacking structure and the semiconductor substrate.

Initially, a lower dielectric layer 26 that charges the gap in the spacing between the metal line layers is formed through a HDP (High Density Plasma) method or an SOG (Spin On Glass) method. Then an inter-level dielectric layer 27 is formed over the lower dielectric layer 26 such that it can cover a topology effect (irregular surface) of the lower dielectric layer 26. The inter-level dielectric layer 27 is then under planarization through a chemical mechanical polishing process or through an etch back process.

Figure 2F:
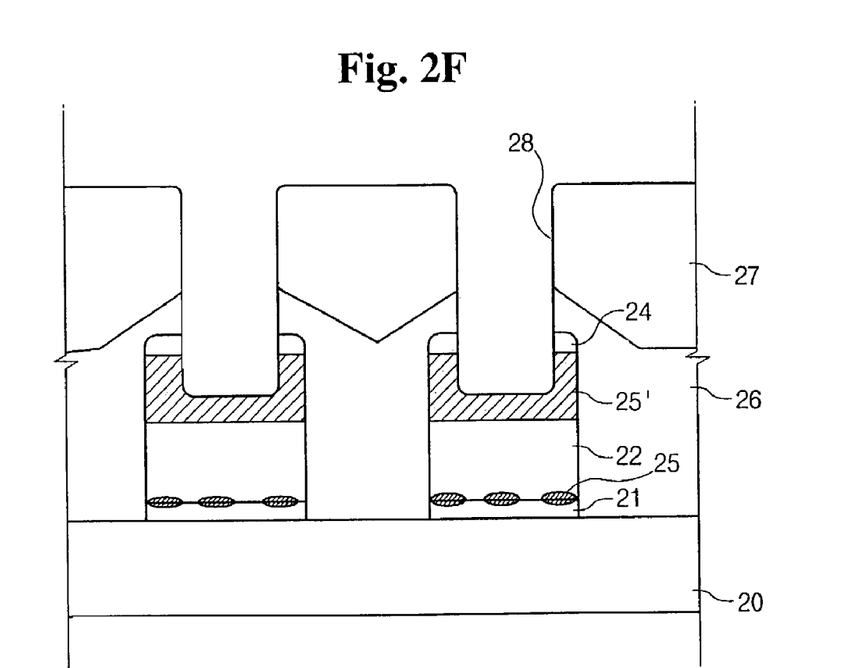

As shown in FIG. 2f, a contact hole 28 is then formed by etching the inter-level dielectric layer 27, the lower dielectric layer 26, the TiN layer 24, and a predetermined depth of the $TiAl_3$ layer 25', with a predetermined width.

At this time, in order to decrease resistance of the contact hole 28 and to decrease a change of a resistance of the contact hole in a wafer, the TiN layer 24 is over-etched, and etching is terminated in the $TiAl_3$ layer 25'. Further, more than 50 □ of the $TiAl_3$ layer 25' under the contact hole 18 is preferably left not etched, and the remaining portion of the $TiAl_3$ layer 25 prevents the metal layer 22 from upwardly extruding.

Figure 2G:
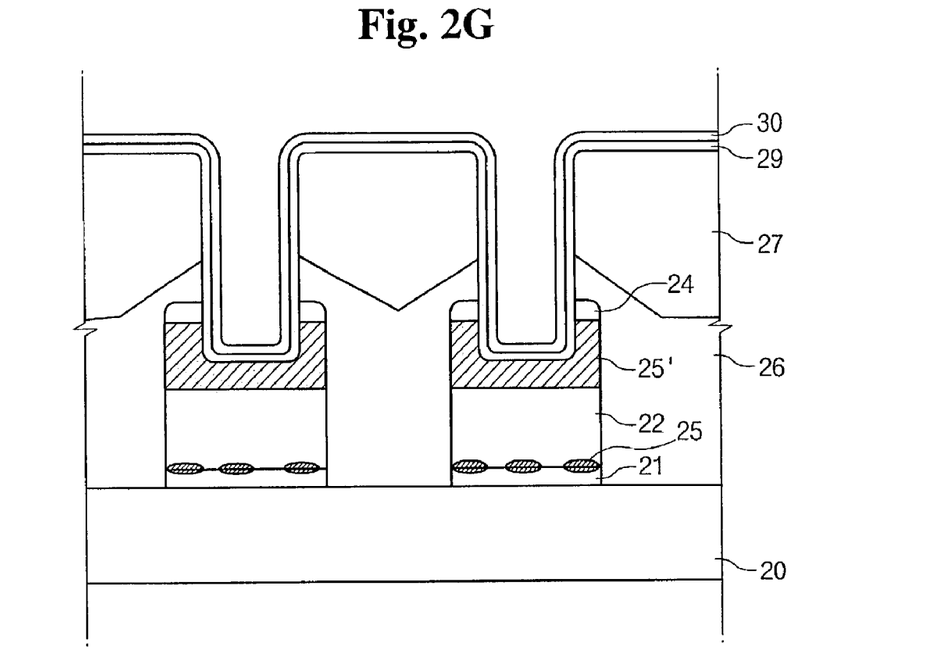

As shown in FIG. 2g, a barrier metal having a stacking layer structure of a titanium (Ti) layer (hereinafter referred to as a Ti layer) 29 and a titanium nitride (TiN) layer (hereinafter referred to as a TiN layer) 30 is formed on the inter-level dielectric layer 27 and an inner wall of the contact hole 28 through an in-situ method.

Because the contact holes are now formed deeper and narrower as the integration degree of semiconductor devices has increased, it is preferable that the TiN layer 30 is formed through a CVD (chemical vapor deposition) method in order to increase the bottom step coverage of the barrier metal.

That is, the Ti layer 29 is formed through a physical vapor deposition (PVD) method, and the TiN layer 30 is formed through the CVD method. During the formation of the Ti layer 29 through the PVD method, the temperature of the substrate is regulated to 100 to 300 degrees Celsius, and during the formation of the TiN layer 30 through the CVD method, the temperature of the substrate is regulated to be 400 to 450 degrees Celsius.

Since the $TiAl_3$ layer 25', which is formed by the reaction of the plasma-treated metal layer 22 and the Ti layer 23, prevents the up-extrusion of the metal layer 22, the TiN layer 30 having a predetermined thickness is deposited on a inner wall of the contact hole 28.

Figure 2H:
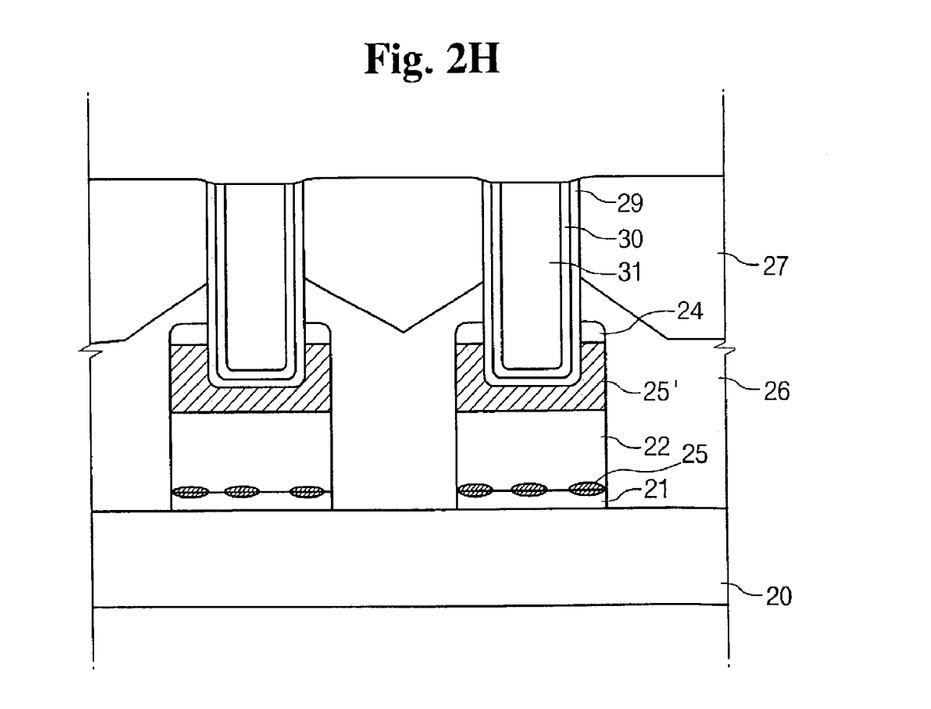

As shown in FIG. 2h, a metal layer acting as a metal plug 31, which is formed of tungsten (W), Al, copper (Cu), a tungsten-silicon (W—Si) alloy, or an aluminum (Al) alloy, is formed on the TiN layer 30 through a chemical vapor deposition (CVD) method such that an inside of the contact hole 28 is fully charged.

The deposited metal layer and the barrier metal (the Ti layer 29 and the TiN layer 30) are then under planarization through a chemical mechanical polishing (CMP) process until the inter-level dielectric layer 27 is exposed. Consequently, the metal layer is left remaining as a form of a metal plug 31.

Because the TiN layer 30 particularly on the bottom of the contact hole has a sufficient thickness for functioning as a barrier, impurities generated by a reaction of source material for the formation of the metal plug 31 and material of the metal layer 22 can be prevented so that a cause of an increase of the resistance of the contact hole can be removed.

For example, if the metal plug 31 is made of tungsten (W) and the metal layer 22 is made of aluminum (Al), a reaction between F of $WF_6$ that is used for the deposition of tungsten and aluminum can be prevented.

As another planarization method, an etch back process for the metal layer can be performed.

The metal line stacking structure in a semiconductor device is formed according to the above-stated method, and these processes are repeatedly performed according to a number of metal layers that are needed in a specific semiconductor device.

As stated above, in the method according to the preferred embodiment of the present invention, the uniform and thick $TiAl_3$ layer is formed during the sintering process due to the plasma treatment of the metal layer and the sintering process, and etching is finished in the $TiAl_3$ layer so that a predetermined thickness of the $TiAl_3$ remains under the contact hole. Therefore, the metal layer can be prevented from upwardly extruding while forming the barrier metal in the contact hole.

Furthermore, impurities generated by a reaction between the source material for the formation of the metal plug and the metal layer can be prevented. For example, $TiAl_xF_y$ generated by a reaction of $WF_6$ that is used for forming a tungsten plug and Al can be prevented.

Still furthermore, a formation of the contact hole void by outgassing during the formation of the metal plug can be prevented so that performance degradation of a semiconductor device can be prevented.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A metal line stacking structure in a semiconductor device, comprising:
    a metal line layer on a lower dielectric layer being disposed over the semiconductor substrate, the metal line layer having a predetermined width and including a first barrier metal, a first metal layer, and a second barrier metal that are sequentially stacked;
    metal compound portions formed in interface between the first barrier metal and the first metal layer;
    a metal compound layer formed in interface between the first metal layer and the second barrier metal;
    an inter-level dielectric layer formed over all the lower dielectric layer and the metal line layer;
    a contact hole formed in the inter-level dielectric layer, a bottom of which is positioned within the metal compound layer; and
    a metal plug being filled in the contact hole,
    wherein the metal compound layer has a thickness greater than that of the metal compound portion.

2. The metal line stacking structure of claim 1, wherein the second barrier metal includes a titanium nitride (TiN) layer having a thickness of between 200 and 600 angstroms.

3. The metal line stacking structure of claim 2, wherein the first metal layer is formed of a material selected from the group consisting of aluminum, an aluminum-copper alloy, an aluminum-copper-silicon alloy, and an aluminum-silicon alloy, and wherein the first metal layer has a thickness of between 3000 and 8000 angstroms.

4. The metal line stacking structure of claim 3, wherein the metal compound layer comprises $TiAl_3$.

5. The metal line stacking structure of claim 3, wherein the first barrier metal includes titanium (Ti), and wherein the metal compound portions comprise $TiAl_3$ that is generated by a reaction between aluminum (Al) of the first metal layer and titanium (Ti) of the first barrier metal.

6. The metal line stacking structure of claim 1, further comprising a third barrier metal formed on an inner wall of the contact hole.

7. The metal line stacking structure of claim 1, wherein the metal compound layer under the contact hole has a thickness of more than 50 angstroms.

* * * * *